(12) United States Patent
Partridge et al.

(10) Patent No.: US 8,018,077 B2
(45) Date of Patent: Sep. 13, 2011

(54) ELECTROMECHANICAL SYSTEM HAVING A CONTROLLED ATMOSPHERE, AND METHOD OF FABRICATING SAME

(75) Inventors: Aaron Partridge, Palo Alto, CA (US); Markus Lutz, Palo Alto, CA (US); Silvia Kronmueller, Schwaikheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/403,468

(22) Filed: Mar. 13, 2009

(65) Prior Publication Data

US 2009/0309175 A1    Dec. 17, 2009

Related U.S. Application Data

(62) Division of application No. 10/392,528, filed on Mar. 20, 2003, now Pat. No. 7,514,283.

(51) Int. Cl.
    *H01L 23/29*      (2006.01)
(52) U.S. Cl. ............... 257/790; 257/795; 257/E31.117; 438/50; 438/52
(58) Field of Classification Search ............. 257/417, 257/790, 795; 216/2, 80; 438/48, 50, 52
See application file for complete search history.

(56) References Cited

U.S. PATENT DOCUMENTS

| | | | |
|---|---|---|---|
| 4,674,319 A | 6/1987 | Muller et al. | |
| 5,164,329 A | 11/1992 | Moyer et al. | |
| 5,427,975 A | * 6/1995 | Sparks et al. | ............ 438/52 |
| 5,455,547 A | 10/1995 | Lin et al. | |
| 5,491,604 A | 2/1996 | Nguyen et al. | |
| 5,537,083 A | 7/1996 | Lin et al. | |
| 5,589,082 A | 12/1996 | Lin et al. | |
| 5,839,062 A | 11/1998 | Nguyen et al. | |
| 5,955,932 A | 9/1999 | Nguyen et al. | |
| 5,969,249 A | 10/1999 | Roessig et al. | |
| 5,992,233 A | 11/1999 | Clark | |
| 6,035,714 A | 3/2000 | Yazdi et al. | |
| 6,067,858 A | 5/2000 | Clark et al. | |
| 6,125,700 A | 10/2000 | Tsugai et al. | |
| 6,142,358 A | 11/2000 | Cohn et al. | |
| 6,146,917 A | 11/2000 | Zhang et al. | |
| 6,147,756 A | 11/2000 | Zavracky et al. | |
| 6,149,190 A | 11/2000 | Galvin et al. | |
| 6,153,839 A | 11/2000 | Zavracky et al. | |
| 6,156,652 A | 12/2000 | Michalicek | |
| 6,163,643 A | 12/2000 | Bergmann et al. | |
| 6,170,332 B1 | 1/2001 | MacDonald et al. | |
| 6,187,210 B1 | 2/2001 | Lebouitz et al. | |
| 6,192,757 B1 | 2/2001 | Tsang et al. | |

(Continued)

FOREIGN PATENT DOCUMENTS

DE     19961578     6/2001
(Continued)

*Primary Examiner* — Wai-Sing Louie
(74) *Attorney, Agent, or Firm* — Kenyon & Kenyon LLP

(57) ABSTRACT

There are many inventions described and illustrated herein. In one aspect, the present invention is directed to a technique of fabricating or manufacturing MEMS having mechanical structures that operate in controlled or predetermined mechanical damping environments. In this regard, the present invention encapsulates the mechanical structures within a chamber, prior to final packaging and/or completion of the MEMS. The environment within the chamber containing and/ or housing the mechanical structures provides the predetermined, desired and/or selected mechanical damping. The parameters of the encapsulated fluid (for example, the gas pressure) in which the mechanical structures are to operate are controlled, selected and/or designed to provide a desired and/or predetermined operating environment.

13 Claims, 10 Drawing Sheets

U.S. PATENT DOCUMENTS

| | | | |
|---|---|---|---|
| 6,199,874 B1 | 3/2001 | Galvin et al. |
| 6,204,085 B1 | 3/2001 | Strumpell et al. |
| 6,210,988 B1 | 4/2001 | Howe et al. |
| 6,230,567 B1 | 5/2001 | Greiff |
| 6,236,281 B1 | 5/2001 | Nguyen et al. |
| 6,249,073 B1 | 6/2001 | Nguyen et al. |
| 6,250,156 B1 | 6/2001 | Seshia et al. |
| 6,296,779 B1 | 10/2001 | Clark et al. |
| 6,297,072 B1 | 10/2001 | Tilmans et al. |
| 6,300,294 B1 | 10/2001 | Robbins et al. |
| 6,307,815 B1 | 10/2001 | Polosky et al. |
| 6,311,555 B1 | 11/2001 | McCall et al. |
| 6,315,062 B1 | 11/2001 | Alft et al. |
| 6,325,886 B1 | 12/2001 | Harris et al. |
| 6,352,935 B1 | 3/2002 | Collins et al. |
| 6,373,007 B1 | 4/2002 | Calcatera et al. |
| 6,378,989 B1 | 4/2002 | Silverbrook |
| 6,392,144 B1 | 5/2002 | Filter et al. |
| 6,396,711 B1 | 5/2002 | Degani et al. |
| 6,402,968 B1 | 6/2002 | Yazdi et al. |
| 6,416,831 B1 | 7/2002 | Hara et al. |
| 6,424,074 B2 | 7/2002 | Nguyen |
| 6,433,411 B1 | 8/2002 | Degani et al. |
| 6,437,551 B1 | 8/2002 | Krulevitch et al. |
| 6,448,622 B1 | 9/2002 | Franke et al. |
| 6,449,406 B1 | 9/2002 | Fan et al. |
| 6,460,234 B1 | 10/2002 | Gianchandani |
| 6,472,290 B2 | 10/2002 | Cho et al. |
| 6,477,901 B1 | 11/2002 | Tadigadapa et al. |
| 6,483,957 B1 | 11/2002 | Hamerly et al. |
| 6,507,082 B2 | 1/2003 | Thomas |
| 6,508,124 B1 | 1/2003 | Zerbini et al. |
| 6,508,126 B2 | 1/2003 | Sakai et al. |
| 6,550,331 B2 | 4/2003 | Fujii et al. |
| 6,555,901 B1 | 4/2003 | Yoshihara et al. |
| 6,951,824 B2 | 10/2005 | Fischer et al. |
| 2001/0001931 A1 | 5/2001 | Fujii et al. |
| 2001/0009110 A1 | 7/2001 | Tmai |
| 2001/0044035 A1 | 11/2001 | Morii |
| 2003/0141561 A1 | 7/2003 | Fischer et al. |
| 2003/0155643 A1* | 8/2003 | Freidhoff ............. 257/704 |
| 2004/0065932 A1* | 4/2004 | Reichenbach et al. ....... 257/415 |
| 2004/0166603 A1* | 8/2004 | Carley ............. 438/52 |

FOREIGN PATENT DOCUMENTS

| | | |
|---|---|---|
| JP | 5-206518 | 8/1993 |
| JP | 7-111299 | 4/1995 |
| JP | 11-511291 | 11/1999 |
| JP | 2000-30618 | 1/2000 |
| JP | 2000-065855 | 3/2000 |
| JP | 2001-338755 | 12/2001 |
| WO | WO 96/37784 | 11/1996 |
| WO | WO 01/46066 | 6/2001 |
| WO | WO 01/58803 | 8/2001 |
| WO | WO 01/58804 | 8/2001 |
| WO | WO 01/77009 | 10/2001 |

* cited by examiner

ELECTROMECHANICAL SYSTEM HAVING A CONTROLLED ATMOSPHERE, AND METHOD OF FABRICATING SAME

CROSS-REFERENCE TO RELATED APPLICATION

This application is a divisional of, and incorporates herein by reference in its entirety the contents of, U.S. patent application Ser. No. 10/392,528 now U.S. Pat. No. 7,514,283, which was filed on Mar. 20, 2003.

BACKGROUND

This invention relates to electromechanical systems and techniques for fabricating microelectromechanical and nanoelectromechanical systems; and more particularly, in one aspect, to fabricating or manufacturing microelectromechanical and nanoelectromechanical systems having microstructures encapsulated in a relatively stable, controlled pressure environment to provide, for example, a predetermined, desired and/or selected mechanical damping of the microstructure.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

In order to protect the delicate mechanical structure, MEMS are typically packaged in, for example, a hermetically sealed metal container (for example, a TO-8 "can," see, for example, U.S. Pat. No. 6,307,815) or bonded to a semiconductor or glass-like substrate having a chamber to house, accommodate or cover the mechanical structure (see, for example, U.S. Pat. Nos. 6,146,917; 6,352,935; 6,477,901; and 6,507,082). In this regard, in the context of the hermetically sealed metal container, the substrate on, or in which, the mechanical structure resides may be disposed in and affixed to the metal container. In contrast, in the context of the semiconductor or glass-like substrate packaging technique, the substrate of the mechanical structure may be bonded to another substrate whereby the bonded substrates form a chamber within which the mechanical structure resides. In this way, the operating environment of the mechanical structure may be controlled and the structure itself protected from, for example, inadvertent contact.

When employing such conventional packaging techniques, the resulting MEMS tend to be quite large due primarily to packaging requirements or constraints. In this regard, conventional MEMS packaging techniques often produce finished devices that are quite large relative to the small mechanical structure. In the context of packaging in a metal container, this is due to the size of the container itself since it is quite large relative to the mechanical structure. Where the MEMS employs a substrate packaging technique, the substrate on or in which the mechanical structure resides must have a sufficient periphery to permit or facilitate the two substrates to be bonded using, for example, epoxy, fusion, glass frit or anodic techniques. That periphery tends to significantly increase the size of the resulting MEMS.

The operation of the MEMS depends, to some extent, on the environment in which the mechanical structure is contained and is to operate (for example, the pressure within the metal container). MEMS such as accelerometers tend to operate more effectively in high damping environments whereas gyroscopes and resonators tend to operate more effectively in low damping environments. Accordingly, the mechanical structures that comprise the accelerometer are often packaged in a high pressure environment. In contrast, the mechanical structures that comprise gyroscopes and resonators are often packaged and maintained in a low pressure environment. For example, when gyroscopes and resonators are packaged in a metal container, the pressure in the container is reduced, and often the ambient gases are substantially evacuated, prior to sealing.

There is a need for MEMS (for example, gyroscopes, resonators, temperature sensors and/or accelerometers) that (1) overcome one, some or all of the shortcomings of the conventional packaging techniques and (2) include a controlled or controllable environment for proper, enhanced and/or optimum operation of the mechanical structures.

SUMMARY OF THE INVENTION

There are many inventions described and illustrated herein. In a first principal aspect, the present invention is a method of sealing a chamber of an electromechanical device (for example, a microelectromechanical or a nanoelectromechanical device) having a mechanical structure, wherein the mechanical structure is in the chamber and the chamber includes a fluid that is capable of providing mechanical damping for the mechanical structure. The method of this aspect of the invention includes depositing a first encapsulation layer over a sacrificial layer that is disposed over at least a portion of the mechanical structure. At least one vent is formed through the encapsulation layer to expose at least a portion of the sacrificial layer and at least a portion of the sacrificial layer is removed to form the chamber. The method further includes introducing at least one relatively stable gas into the chamber while depositing a second encapsulation layer over or in the vent whereby when the chamber is sealed, the fluid within the chamber includes the relatively stable gas(es).

In one embodiment, the relatively stable gas(es) may be helium, nitrogen, neon, argon, krypton, xenon and/or perfluorinated hydrofluorocarbons (for example, $CF_4$ and $C_2F_6$), and/or combinations thereof. In a preferred embodiment, the relatively stable gas(es) includes a low diffusivity.

In another embodiment of this aspect of the invention, the second encapsulation layer may include a silicon-bearing compound, for example, monocrystalline silicon, polycrystalline silicon, silicon dioxide, silicon carbide, silicides, BPSG, PSG or silicon nitride. The second encapsulation layer may be deposited using an epitaxial or a CVD reactor.

In another principal aspect, the present invention is a method of sealing a chamber of an electromechanical device (for example, a microelectromechanical or a nanoelectromechanical device) having a mechanical structure, wherein the mechanical structure is in the chamber and wherein the chamber includes a fluid that is capable of providing mechanical damping for the mechanical structure. The method of this aspect of the invention includes depositing a first encapsulation layer over the mechanical structure, forming at least one vent through the encapsulation layer and forming the chamber. The method further includes depositing a second encapsulation layer by introducing at least one gaseous deposition reagent into an epitaxial or CVD reactor to thereby form a second encapsulation layer over or in the vent to thereby seal the chamber. The fluid within the chamber includes at least one by-product resulting from depositing a second encapsulation layer and wherein the pressure of the fluid is sufficient to provide a predetermined mechanical damping for the mechanical structure.

In one embodiment, the method further includes introducing at least one relatively stable gas into the chamber while depositing the second encapsulation layer over or in the vent. The fluid in the chamber may also include the relatively stable gas(es), in addition to the by-product resulting from depositing a second encapsulation layer. In one embodiment, the relatively stable gas(es) may be helium, nitrogen, neon, argon, krypton, xenon and/or perfluorinated hydrofluorocarbons.

The second encapsulation layer of this aspect of the present invention may include a silicon-bearing compound, for example, a polycrystalline silicon, silicon dioxide, silicon carbide, silicides, BPSG, PSG or silicon nitride. The second encapsulation layer may be deposited using an epitaxial or a CVD reactor. Indeed, the method may also include heating the fluid in the chamber to adjust the pressure of the fluid to be within a predetermined range of pressures.

In yet another principal aspect, the present invention is an electromechanical device, for example, a microelectromechanical or nanoelectromechanical device, including a chamber having a first encapsulation layer disposed thereon. The first encapsulation layer includes at least one vent. The electromechanical device also includes a mechanical structure, which is disposed in the chamber. A second encapsulation layer, deposited over or in the vent, seals the chamber wherein the chamber includes at least one relatively stable gas (for example, helium, nitrogen, neon, argon, krypton, xenon or perfluorinated hydrofluorocarbons (such as, $CF_4$ and $C_2F_6$), and/or combinations thereof).

In one embodiment, the second encapsulation layer is deposited using an epitaxial, a sputtering or a CVD reactor. In another embodiment, the first encapsulation layer is also deposited using an epitaxial, a sputtering or a CVD reactor.

In yet another embodiment, the second encapsulation layer is a silicon-bearing compound, for example, monocrystalline silicon, polycrystalline silicon, silicon dioxide, BPSG, PSG, silicon nitride, silicon carbide or silicides.

The electromechanical device of this aspect of the present invention may include a third encapsulation layer, disposed over the second encapsulation layer, to reduce the diffusion of the fluid. In one embodiment, the third encapsulation layer is a metal (for example, aluminum, chromium, gold, silver, molybdenum, platinum, palladium, tungsten, titanium, and/or copper), metal oxide (for example, aluminum oxide, tantalum oxide, and/or indium oxide), metal alloy (for example, titanium-nitride, titanium-tungsten and/or Al—Si—Cu) and/or metal-silicon compound (for example, silicides such as tungsten silicide, titanium silicide, and/or nickel silicide) (hereinafter, collectively called "metal bearing material(s)") which is deposited using an epitaxial, a sputtering or a CVD reactor. In another embodiment, the third encapsulation layer is at least one of monocrystalline silicon, polycrystalline silicon, silicon dioxide, BPSG, PSG, silicon nitride or silicon carbide.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

Figure 1:
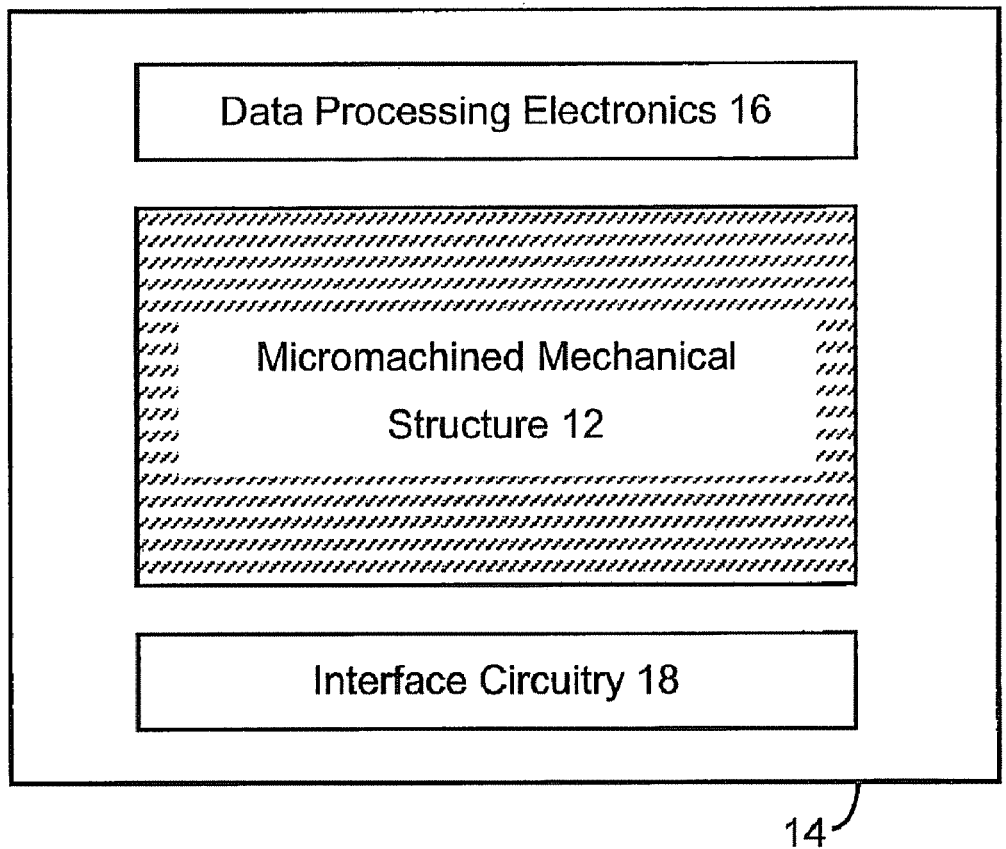
FIG. 1 is a block diagram of microelectromechanical system disposed on a substrate, in conjunction with interface circuitry and data processing electronics.

There are many inventions described and illustrated herein. In one aspect, the present invention is directed to a technique of fabricating or manufacturing MEMS having mechanical structures that operate in controlled or predetermined mechanical damping environments. In this regard, the present invention encapsulates the mechanical structures within a chamber, prior to final packaging and/or completion of the MEMS. The environment within the chamber containing and/or housing the mechanical structures provides the predetermined, desired and/or selected mechanical damping. The parameters (for example, pressure) of the encapsulated fluid (for example, a gas or a gas vapor) in which the mechanical structures are to operate are controlled, selected and/or designed to provide a desired and/or predetermined operating environment.

In one embodiment, one or more relatively stable gases, having a selected, desired and/or predetermined state(s), are introduced during the encapsulation process. The relatively stable gas(es) experiences little to no reaction, during the encapsulation process, with, for example, the mechanical structures, materials used to encapsulate the mechanical structures (i.e., the deposition reagents) and/or the products produced during the process (whether in a gas or solid form). As such, once the chamber containing and/or housing the mechanical structures is "sealed" by way of the encapsulation process, the relatively stable gas is "trapped" within the chamber. The state of the gas(es) within the chamber determine, to a significant extent, the predetermined, desired and/or selected mechanical damping of the mechanical structures.

This relatively stable gas(es), for example, helium, nitrogen, neon, argon, krypton, xenon and/or perfluorinated hydrofluorocarbons (for example, $CF_4$ and $C_2F_6$), may comprise the majority, all or substantially all of the fluid within the sealed chamber (i.e., the chamber containing the encapsulated mechanical structures). In a preferred embodiment, the relatively stable gas(es) includes a low, well-known and/or controllable diffusivity during and after encapsulation process. In this way, the state of the gas(es) may be controlled, selected and/or designed to provide a desired and/or predetermined environment over the operating lifetime of the finished MEMS and/or after, for example, subsequent micromachining processing (for example, high temperature processes).

In another embodiment, one or more gases are introduced during the encapsulation process with the expectation that those gases will react with the environment during and/or after the encapsulation process. In this embodiment, the predetermined gases react and/or combine with gas(es), material(s) and/or by-product(s) resulting from, or produced during the encapsulation process, to provide a desired and/or predetermined fluid (having a desired, selected and/or predetermined state) that is trapped within the "sealed" chamber containing the encapsulated mechanical structures. In this way, the fluid, having a selected, desired and/or predetermined state, resides or is maintained within the chamber containing the mechanical structures and provides a desired, predetermined and/or selected mechanical damping for those structures.

The one or more gases may be a primary or a secondary reagent in the forming, growing and/or depositing the encapsulation layer(s). Alternatively, (or in addition to) these gases may be additional gases that are not significant in forming, growing and/or depositing the encapsulation layer(s). In this regard, these additional gases may react with materials (solids and/or gases) in the deposition environment to produce by-product(s) that are trapped in the chamber after encapsulation.

It should be noted that the state of the fluid that is trapped may be adjusted, modified and/or controlled by subsequent processing steps. In this regard, the state of the fluid (for example, the pressure) immediately after encapsulation may be adjusted, modified and/or controlled by a subsequent micromachining and/or integrated circuit processing which may cause or promote, for example, (1) additional reaction(s) between the "trapped" fluid and the other elements of the environment within the chamber (for example, the material surrounding or comprising the mechanical structures) and/or (2) diffusion of the "trapped" fluid or by-products thereof. As such, in certain embodiments, the fluid that is trapped within the sealed chamber may undergo further change during and/or after encapsulation process such that, after completion of the MEMS, the state of the fluid within the sealed chamber provides the desired, predetermined and/or selected mechanical damping for the mechanical structures. Thus, in these embodiments, the state of the fluid may be adjusted, modified and/or controlled to provide the desired and/or predetermined environment over the operating lifetime of the finished MEMS and/or after subsequent micromachining and/or integrated circuit processing.

With reference to FIG. 1, in one exemplary embodiment, a MEMS 10 includes a micromachined mechanical structure 12 that is disposed on substrate 14, for example, an undoped semiconductor-like material, a glass-like material, or an insulator-like material. The MEMS 10 may also include data processing electronics 16, to process and analyze information generated by micromachined mechanical structure 12. In addition, MEMS 10 may also include interface circuitry 18 to provide the information from micromachined mechanical structure 12 and/or data processing electronics 16 to an external device (not illustrated), for example, a computer, indicator or sensor.

The data processing electronics 16 and/or interface circuitry 18 may be integrated in or on substrate 14. In this regard, MEMS 10 may be a monolithic structure including mechanical structure 12, data processing electronics 16 and interface circuitry 18. The data processing electronics 16 and/or interface circuitry 18 may also reside on a separate, discrete substrate that, after fabrication, is bonded to or on substrate 14.

Figure 2:
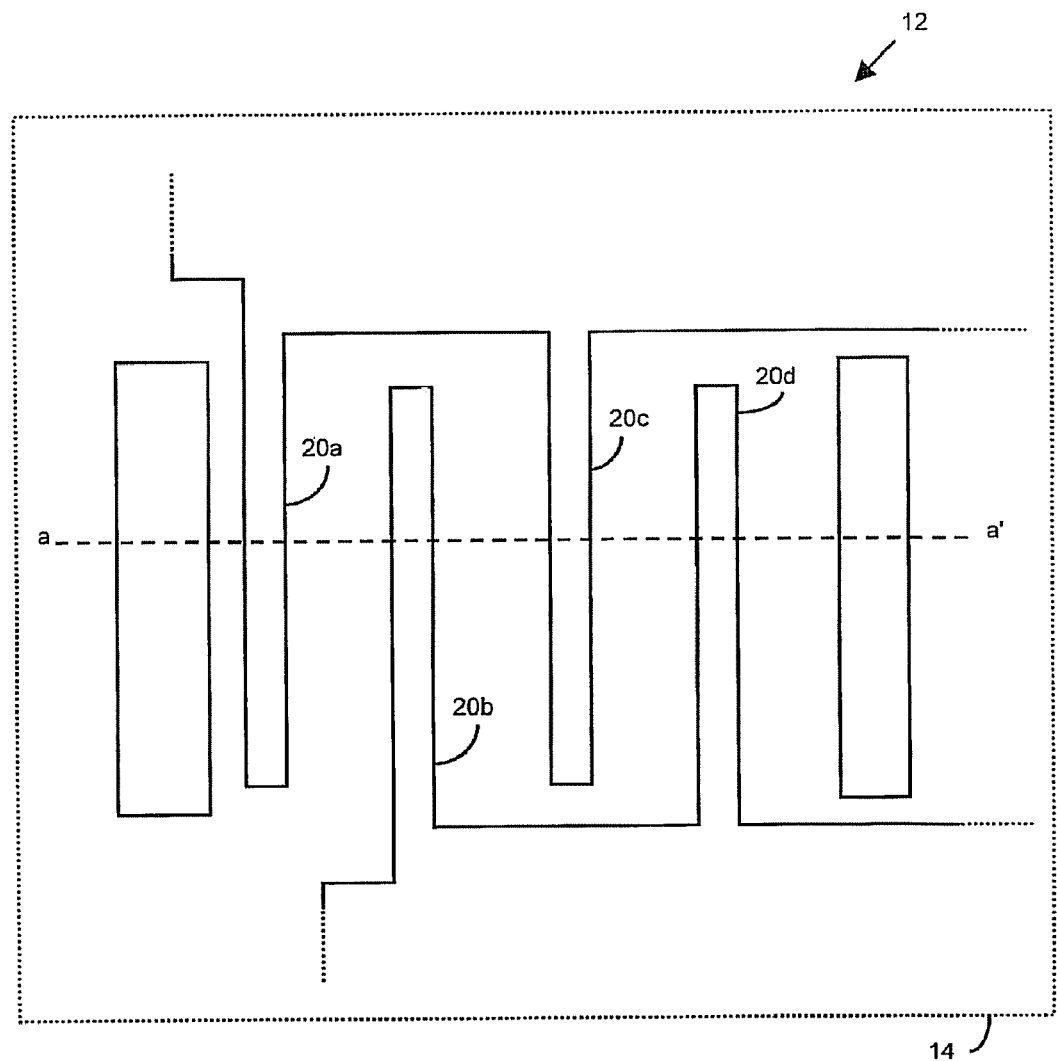
FIG. 2 illustrates a top view of a portion of micromechanical structure, for example, or portion of the interdigitated or comb-like finger electrode arrays of an accelerometer.

With reference to FIG. 2, in one embodiment, micromachined mechanical structure 12 includes mechanical structures 20a-d disposed on, above or in substrate 14. The micromachined mechanical structure 12 may be an accelerometer, gyroscope or other transducer (for example, pressure sensor, tactile sensor or temperature sensor). The micromachined mechanical structure 12 may also include mechanical structures of a plurality of transducers or sensors including one or more accelerometers, gyroscopes, pressure sensors, tactile sensors and temperature sensors. Where micromachined mechanical structure 12 is an accelerometer, mechanical structures 20a-d may be a portion of the interdigitated or comb-like finger electrode arrays that comprise the sensing features of the accelerometer (See, for example, U.S. Pat. No. 6,122,964).

Figure 3:
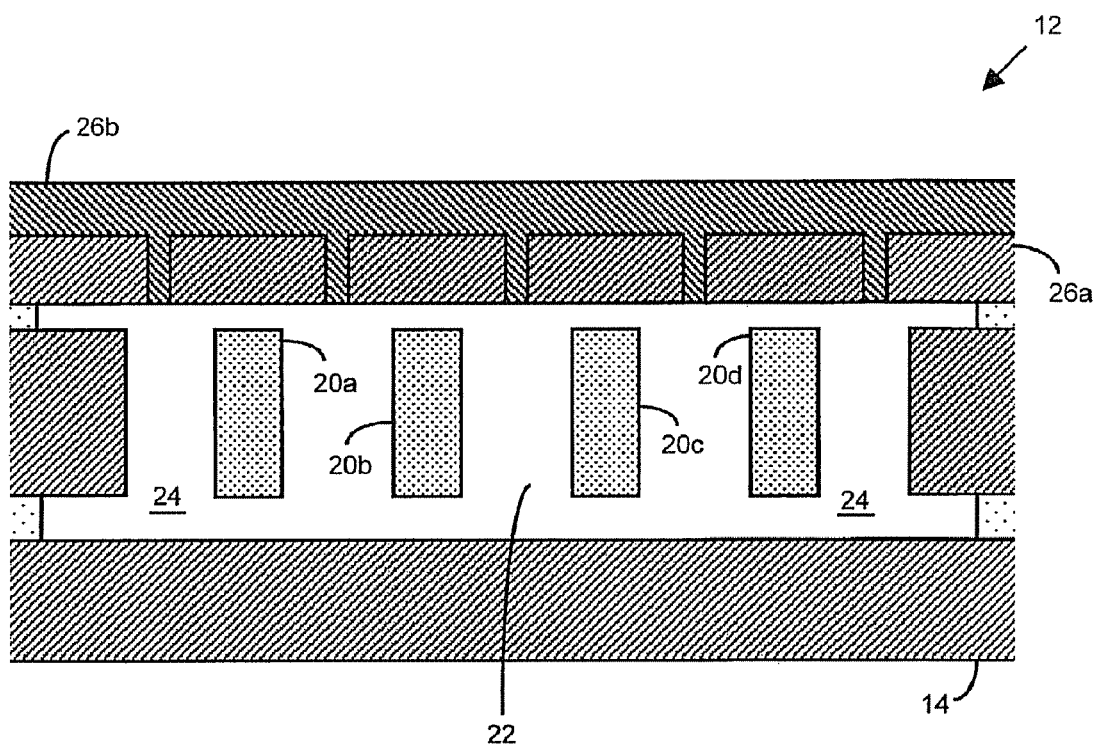
FIG. 3 illustrates a cross-sectional view of the portion of the interdigitated or comb-like finger electrode array of FIG. 2, sectioned along dotted line a-a, in accordance with certain aspect of the present invention.

FIG. 3 illustrates a cross-sectional view of micromachined mechanical structure 12, including mechanical structures 20a-d, along dotted line a-a'. With reference to FIG. 3, in one embodiment, mechanical structures 20a-d are disposed within chamber 22 containing fluid 24, having a selected, desired and/or predetermined state, that is "trapped," "sealed," and/or contained within chamber 22. The fluid 24 provides an environment for mechanical structures 20a-d with a desired, predetermined, appropriate and/or selected mechanical damping.

It should be noted that the mechanical structures of one or more transducers or sensors (for example, accelerometers, gyroscopes, pressure sensors, tactile sensors and/or temperature sensors) may be contained or reside in a single chamber. Under this circumstance, fluid 24 in chamber 22 provides a desired, predetermined, appropriate and/or selected mechanical damping for the mechanical structures of one or more micromachined mechanical structures (for example, an accelerometer, a pressure sensor, a tactile sensor and/or temperature sensor).

Moreover, the mechanical structures of the one or more transducers or sensors may themselves include multiple layers that are vertically stacked and/or interconnected. (See, for example, micromachined mechanical structure 12b of FIG. 9). Thus, under this circumstance, the mechanical structures are fabricated using one or more processing steps to provide the vertically stacked and/or interconnected multiple layers.

In one embodiment, fluid 24 is primarily one or more relatively stable gases (for example, helium, nitrogen, neon, argon, krypton, xenon and/or perfluorinated hydrofluorocarbons such as, $CF_4$ and $C_2F_6$). In another embodiment, fluid 24 is one or more gases or gas/fluid product(s) (for example, $SiH_4+O_2 \rightarrow SiO_2+H_2O+O_2$) that are used in, result from or are produced by or during, the encapsulation process and/or a subsequent fabrication process or processes. Indeed, fluid 24 may be a combination of one or more relatively stable gases and one or more other gases or product(s) that result from, or are produced by, the encapsulation process.

The encapsulating layers 26a and 26b may be comprised of, for example, a semiconductor, an insulator or a metal bearing material. For example, the encapsulating layers 26a and 26b may contain silicon (for example, monocrystalline silicon, polycrystalline silicon or amorphous silicon, whether doped or undoped), and/or nitrogen (for example, a silicon nitride) and/or oxygen (for example, a silicon dioxide). Other materials are suitable for encapsulating or sealing chamber 22 (for example, germanium, silicon/germanium, silicon carbide (SiC), and gallium arsenide). Indeed, all materials that are capable of encapsulating chamber 22 and providing an adequate barrier to diffusion of fluid 24, whether now known or later developed, are intended to be within the scope of the present invention.

The encapsulating layers 26a and 26b may be the same materials or different materials. The encapsulating layers 26a and 26b may be deposited, formed or grown using the same or different techniques. For example, encapsulating layer 26a may be a polycrystalline silicon deposited using a low pressure ("LP") chemically vapor deposited ("CVD") process or plasma enhanced ("PE") CVD process and encapsulating layer 26b may be a polycrystalline silicon deposited using an atmospheric pressure ("AP") CVD process. Alternatively, for example, encapsulating layer 26a may be a silicon dioxide deposited using a LPCVD process and encapsulating layer 26b may be a doped silicon dioxide (for example, phosphosilicate ("PSG") or borophosphosilicate ("BPSG")) using a PECVD process. Indeed, encapsulating layer 26a may be a polycrystalline silicon or doped silicon dioxide (for example, PSG or BPSG) using a PECVD process and encapsulating layer 26b may be a silicon dioxide deposited using a LPCVD. Thus, all materials and deposition techniques, and permutations thereof, for encapsulating chamber 22, whether now known or later developed, are intended to be within the scope of the present invention.

It should be noted that the encapsulating layers 26a and/or 26b may be selected in conjunction with the selection of the one or more predetermined gases in order to provide the gas/fluid product(s) that result from or are produced by the encapsulation process and/or subsequent fabrication process(es). For example, employing $SiH_4+O_2$ may produce encapsulating layer 26b of $SiO_2$ and fluid 24 of $H_2O+O_2$. In another embodiment, employing $SiO_4(CH_4)x+O_2$ may produce encapsulating layer 26b of $SiO_2$ and fluid 24 of $O_2$+various carbon containing by-products.

Figure 4A:
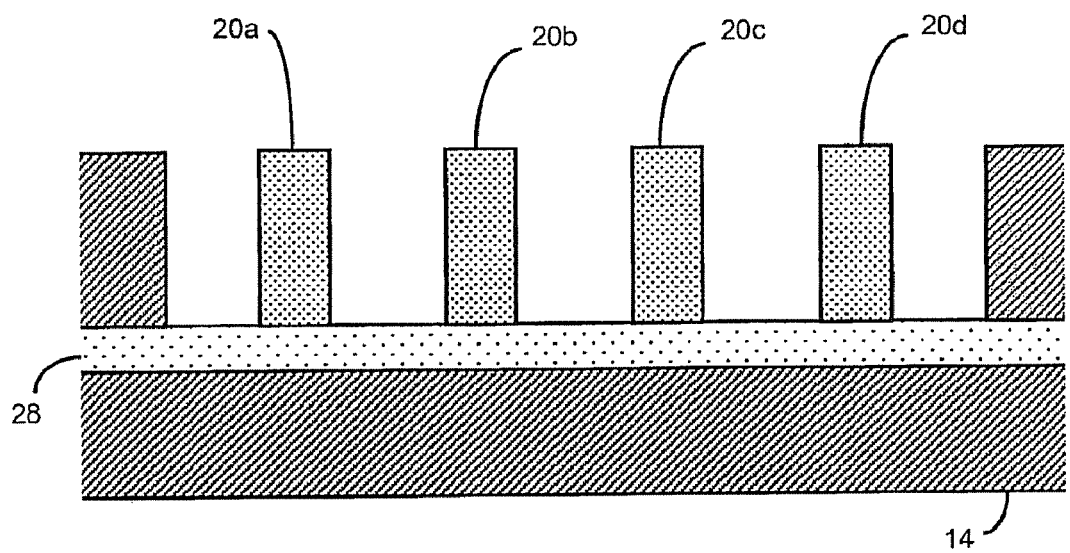
FIGS. 4A-4F illustrate cross-sectional views of the fabrication of the microstructure of FIG. 3 at various stages of an encapsulation process, according to certain aspects of the present invention.

With reference to FIG. 4A, the exemplary method of fabricating or manufacturing a micromachined mechanical structure 12 may begin with a partially formed device including mechanical structures 20a-d disposed on sacrificial layer 28, for example, silicon dioxide. Mechanical structures 20a-d and sacrificial layer 28 may be formed using well known deposition, lithographic, etching and/or doping techniques.

Figure 4B:
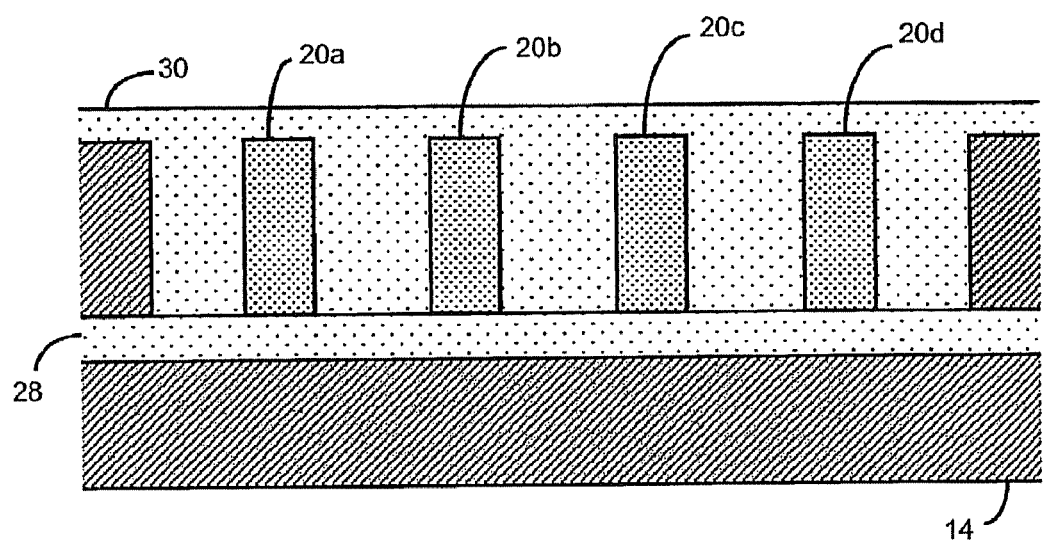
Figure 4C:
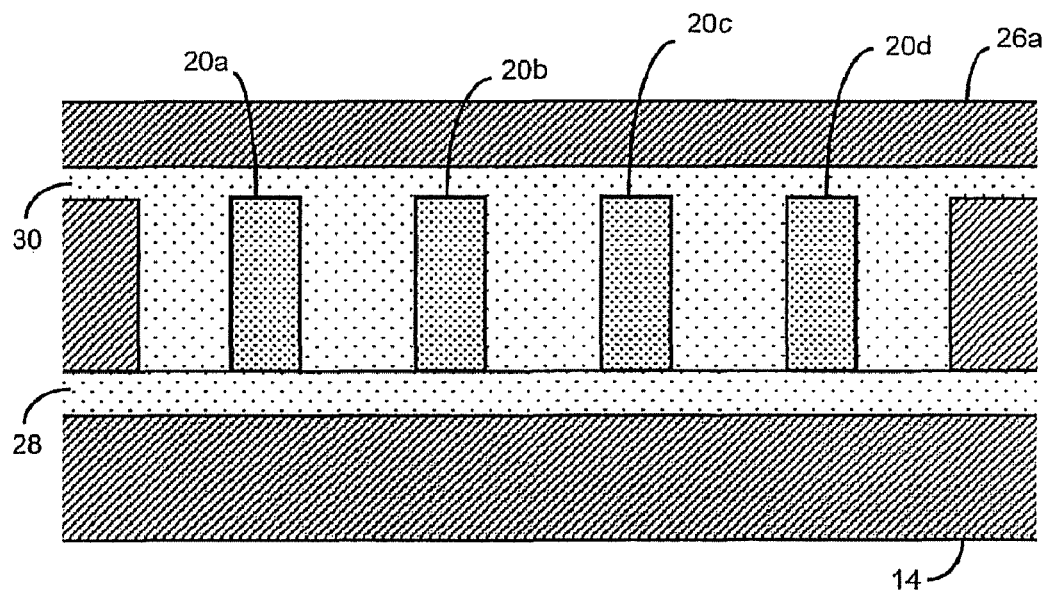
Figure 4D:
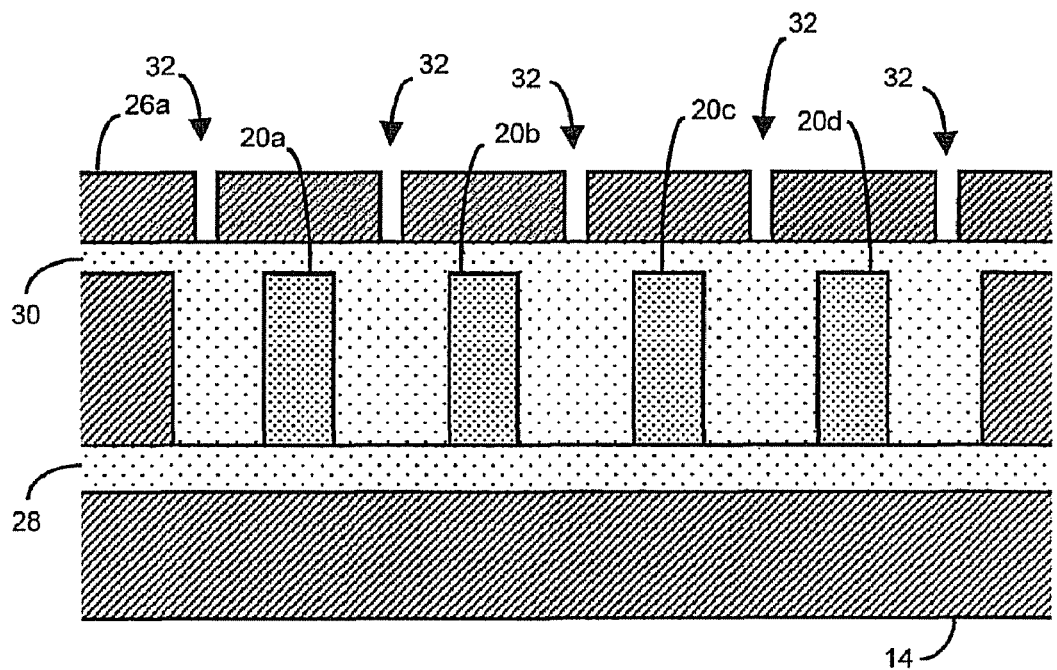

With reference to FIGS. 4B, 4C and 4D, following formation of mechanical structures 20a-d, second sacrificial layer 30, for example, silicon dioxide or silicon nitride, may be deposited to secure, space and/or protect mechanical structures 20a-d during subsequent processing. Thereafter, first encapsulation layer 26a may be deposited on second sacrificial layer 30 (see, FIG. 4C) and etched (see, FIG. 4D) to form passages or vents 32 to permit etching and/or removal of selected portions of first and second sacrificial layers 28 and 30, respectively.

Figure 4E:
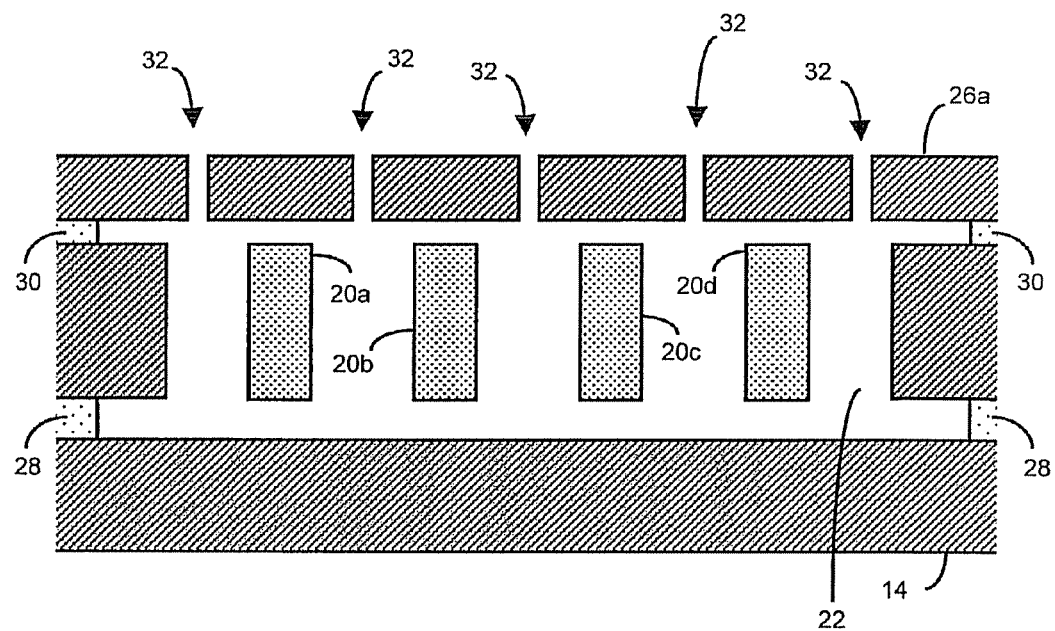

With reference to FIGS. 4D and 4E, first and second sacrificial layers 28 and 30, respectively, may be etched to remove selected portions of layers 28 and 30 and release mechanical structures 20a-d. For example, in one embodiment, where first and second sacrificial layers 28 and 30 are comprised of silicon dioxide, selected portions of layers 28 and 30 may be removed/etched using well known wet etching techniques and buffered HF mixtures (i.e., a buffered oxide etch) or well known vapor etching techniques using vapor HF. Proper design of mechanical structures 20a-d and sacrificial layers 28 and 30, and control of the HF etching process parameters may permit the sacrificial layer 28 to be sufficiently etched to remove all or substantially all of layer 28 around mechanical elements 20a-d and thereby release mechanical elements 20a-d to permit proper operation of MEMS 10.

In another embodiment, where first and second sacrificial layers 28 and 30 are comprised of silicon nitride, selected portions of layers 28 and 30 may be removed/etched using phosphoric acid. Again, proper design of mechanical structures 20a-d and sacrificial layers 28 and 30, and control of the wet etching process parameters may permit the sacrificial layer 28 to be sufficiently etched to remove all or substantially all of sacrificial layer 28 around mechanical elements 20a-d which will release mechanical elements 20a-d.

It should be noted that there are: (1) many suitable materials for layers 28 and/or 30 (for example, silicon dioxide, silicon nitride, and doped and undoped glass-like materials, e.g., PSG, BPSG, and spin on glass ("SOG")), (2) many suitable/associated etchants (for example, a buffered oxide etch, phosphoric acid, and alkali hydroxides such as, for example, NaOH and KOH), and (3) many suitable etching or removal techniques (for example, wet, plasma, vapor or dry etching), to eliminate, remove and/or etch sacrificial layers 28 and/or 30. Indeed, layers 28 and/or 30 may be a doped or undoped semiconductor (for example, polysilicon, germanium or silicon/germanium) in those instances where mechanical structures 20a-d are the same or similar semiconductors (i.e., processed, etched or removed similarly) provided that mechanical structures 20a-d are not affected by the etching or removal processes (for example, where structures 20a-d are "protected" during the etch or removal process (e.g., an oxide layer protecting a silicon based structures 20a-d) or where structures 20a-d are comprised of a material that is neither affected nor significantly affected by the etching or removal process of layers 28 and/or 30). Accordingly, all materials, etchants and etch techniques, and permutations thereof, for eliminating, removing and/or etching, whether now known or later developed, are intended to be within the scope of the present invention.

Figure 4F:
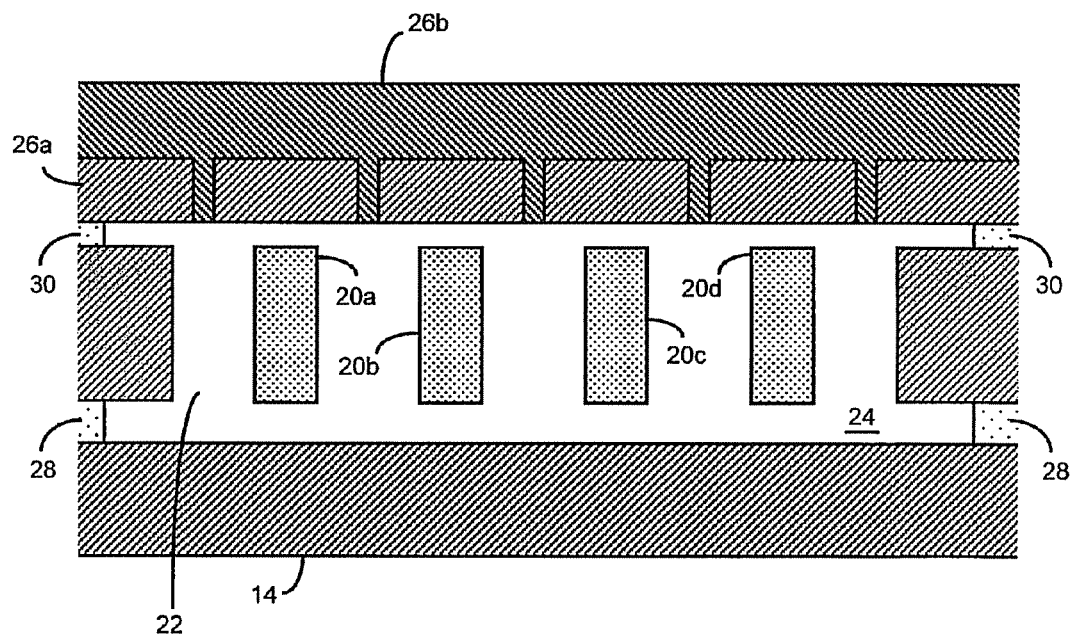
Figure 5:
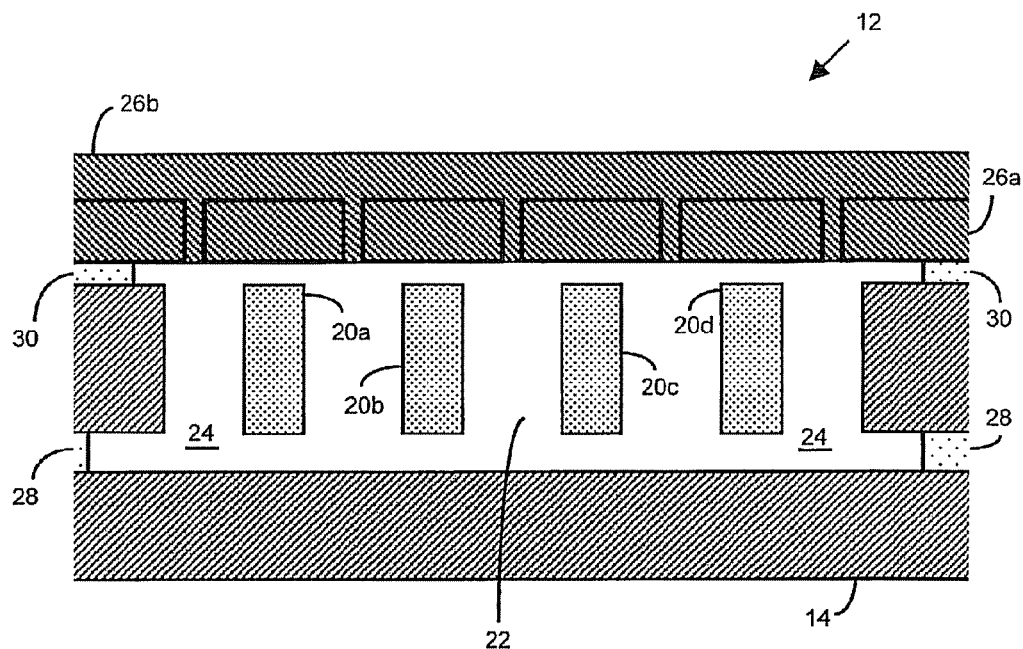
FIG. 5 illustrates a cross-sectional view of the portion of the interdigitated or comb-like finger electrode array of FIG. 2, sectioned along dotted line a-a, in accordance with another aspect of the present invention where the first and second encapsulation layers are comprised of the same material.

With reference to FIG. 4F, after releasing mechanical elements 20a-d, second encapsulation layer 26b may be deposited, formed and/or grown. The second encapsulation layer 26b may be, for example, a silicon-based material (for example, a polysilicon or silicon dioxide), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 26a. However, it may be advantageous to employ the same material to form first and second encapsulation layers 26a and 26b (see, FIG. 5). In this way, the thermal expansion rates are the same and the boundaries between layers 26a and 26b may enhance the "seal" of chamber 24.

In one set of embodiments, during the deposition of second encapsulation layer 26b, in addition to the gases that are employed to form, deposit and/or grow layer 26b (for example, $SiH_4 \rightarrow Si+2H_2$), one or more relatively stable gases (for example, helium, nitrogen, neon, argon, xenon, and/or perfluorinated hydrofluorocarbons) are introduced at a predetermined pressure and flow rate. These relatively stable gases are trapped or encapsulated in chamber 22, during the encapsulation process, to form part or all of fluid 24. As mentioned above, fluid 24 provides an environment for mechanical structures 20a-d with a desired, predetermined and/or selected mechanical damping.

In certain embodiments, the one or more relatively stable gases have or cause little to no reaction during the encapsulation process. For example, the relatively stable gas does not significantly react with mechanical structures 20a-d (for example, the sidewalls of structures 20a-d), the gases/materials used to encapsulate/seal the mechanical structures 20a-d (for example, silicon, oxygen or nitrogen), first encapsulation layer 26a, and/or second encapsulation layer 26b which is formed, deposited and/or grown during the encapsulating/sealing process. Thus, in these embodiments, once chamber 22 containing and/or housing the mechanical structures 20a-d is "sealed" (i.e., after deposition of second encapsulation layer 26b), the relatively stable gas is "trapped" within chamber 22 and provides (or will provide after, for example, subsequent processing steps that finalize the environment) mechanical structures 20a-d with a selected, designed and/or predetermined mechanical damping parameter.

The relatively stable gas(es) may be, for example, any gas (or gas compound) that is relatively stable or controllable: (1) during formation, deposition and/or growth of second encapsulation layer 26b (for example, at the pressure and temperature of the process and with the reagents of that process) and/or (2) with respect to the environment within chamber 22 (for example, causes little to no reaction with first encapsulation layer 26a (for example, silicon dioxide or other silicon-based material). In this way, the one or more relatively stable gases will not react, or will only minimally react, with the deposition reagents, the products, the encapsulated mechanical structure 12 and/or the encapsulation walls during (and, preferably after) formation, deposition and/or growth of second encapsulation layer 26b.

In a preferred embodiment, the one or more relatively stable gases may be helium, nitrogen, neon, argon, krypton, xenon and/or perfluorinated hydrofluorocarbons (for example, $CF_4$ and $C_2F_6$). The relatively stable gas(es) may comprise some, a majority, all or substantially all of fluid 24 within chamber 22 after sealing or isolating chamber 22.

As discussed in detail below, the state of the gas(es) during the encapsulation process may determine the parameters of the gas(es) (and the mechanical damping parameter of the MEMS 10) when sealed within chamber 22. In this regard, the temperature of the encapsulation process and the partial pressure of the relatively stable gas(es) may have a significant impact on the pressure of fluid 24 after encapsulation. As such, in those situations where a relatively high mechanical damping is desired (for example, where micromachined mechanical structure 12 is an accelerometer that requires a low quality factor (Q), it may be advantageous to employ fabrication techniques for forming, depositing and/or growing second encapsulation layer 26b having low temperatures and high pressures. In this way, the final pressure of fluid 24 in chamber 22 may be relatively high.

For example, in one embodiment, where second encapsulation layer 26b is a silicon dioxide (or other insulator, for example, silicon nitride) using LPCVD techniques facilitates "sealing" chamber 22 at a relatively low temperature. In this regard, LPCVD may generally be operated between 100 to 500 Pa and at a relatively low temperature, typically 500° C. to 600° C. In another embodiment, an APCVD may be employed to deposit doped and undoped oxides (for example, BPSG, PSG, and/or $SiO_2$) at relatively high pressures (100 to 10 k Pa) and low temperatures (350° C. to 400° C.). In those instances where second encapsulation layer 26b is a silicon-based material (polysilicon, silicon carbide, silicon dioxide, and/or silicon nitride), an epitaxy reactor may be employed to deposit such a material at pressures between 1 to 2 atmospheres and temperatures between 400° C. to 1200° C.

It should be noted that there are many deposition techniques and materials that are suitable for forming, depositing and/or growing second encapsulation layer 26b. For example, a PECVD technique may be employed to deposit, for example, doped and undoped oxides, silicon nitride silicon carbide, and/or polysilicon at suitable pressures and temperatures. All materials and formation, deposition and growth techniques, and permutations thereof, for forming, depositing and/or growing second encapsulation layer 26b, whether now known or later developed, are intended to be within the scope of the present invention.

In those situations where micromachined mechanical structure 12 undergoes or experiences additional micromachining processing, it may be advantageous to employ one or more relatively stable gases that include a low, well-known and/or controllable diffusivity. For example, gases having larger or heavier molecules (for example, nitrogen, neon, argon, krypton, xenon or perfluorinated hydrofluorocarbons (for example, $CF_4$ and $C_2F_6$)) may be less susceptible to diffusion, via first encapsulation layer 26a and/or second encapsulation layer 26b (and/or at the boundaries thereof), during and after the encapsulation process. In this way, the state of fluid 24 may be controlled, selected and/or designed to provide the desired and/or predetermined environment after, for example, subsequent micromachining processing (for example, high temperature processes) and/or over the operating lifetime of the finished MEMS 10. This may provide MEMS 10 that has or exhibits a more stable and precise operation.

It should be noted that where micromachined mechanical structure 12 undergoes or is subjected to micromachining processing that may impact the environment within chamber 22, fluid 24 may diffuse through encapsulation layer 26a and/or encapsulation layer 26b. That diffusion may cause or result in a "final" ambient pressure of fluid 24 (i.e., the pressure of fluid 24 after completion of MEMS 10) being below or outside of the selected, predetermined and/or desired range of pressures. As such, in one embodiment, the ambient pressure of fluid 24 immediately after being "trapped" or "sealed" in chamber 24 may be selected or designed to be greater than the selected, predetermined and/or desired range of mechanical damping of micromachined mechanical structure 12 required or desired during normal operation. Thus, after any diffusion of fluid 24, as a result of additional processing, the "final" ambient pressure of fluid 24 may be within the selected, predetermined and/or desired range of pressures. In this way, the subsequent micromachining processing causes a reduction in pressure of fluid 24 such that the "final" pressure of fluid 24 provides the selected, designed or predetermined mechanical damping of micromachined mechanical structure 12.

It should be further noted that in those situations where second encapsulation layer 26b (and first encapsulation layer 26a) are comprised of a dense material, it may be advantageous to employ relatively stable gas(es) such as hydrogen and/or helium in addition to, or in lieu of, for example, nitrogen, neon, argon, krypton, xenon and/or perfluorinated hydrofluorocarbons (for example, $CF_4$ and $C_2F_6$). A second encapsulation layer 26b (and first encapsulation layer 26a)

that is comprised of a dense material, for example, silicon carbide, silicon nitride, or metal bearing material, may provide a sufficient barrier to diffusion which thereby permits use of relatively stable gases that are light, have small molecules and are relatively inexpensive and available, such as hydrogen and/or helium.

In another set of embodiments, during the deposition, growth and/or formation of second encapsulation layer 26b, one or more gases/materials are introduced to form, deposit and/or grow second encapsulation layer 26b (for example, $SiH_4 \rightarrow Si+2H_2$), with the expectation that these gases will react during the encapsulation process to provide a resulting fluid (having a desired, selected and/or predetermined state) that is trapped within chamber 22—after second encapsulation layer 26b "seals" chamber 22. In these embodiments, the predetermined gas/material are primary or secondary reagents of the deposition process and, in addition to being major/secondary constituents in the formation of second encapsulation layer 26b, also provide fluid 24 (having a desired, selected and/or predetermined state) that is "trapped" within chamber 22. In this way, fluid 24 provides a desired, predetermined and/or selected mechanical damping for the structures 20a-d.

Thus, in these embodiments, the predetermined gas/material are primary or secondary reagents of the deposition process to react and/or combine with a gas, material(s) and/or by-product(s) produced during the encapsulation process.

For example, in one embodiment, where the second encapsulation layer 26b is silicon dioxide (for example, $SiH_4 + O_2 \rightarrow SiO_2 + H_2O + O_2$), an APCVD may be employed to deposit the oxide at relatively high pressures (100 to 10 kPa) and low temperatures (350° C. to 400° C.). The residual $H_2O+O_2$ (i.e., fluid 24) may be "trapped" in chamber 22 at a relatively high pressure and relatively low temperature. Indeed, where necessary or desired, the pressure of fluid 24 may be adjusted or modified during subsequent processing steps to provide the desired, predetermined and/or selected mechanical damping for mechanical structures 20a-d.

In another embodiment, an epitaxy reactor may be employed to deposit the second encapsulation layer 26b as a polysilicon at pressures between 1 to 2 atmospheres and temperatures between 400° C. to 1200° C. (for example, $SiCl_4$ (gas)$+2H_2 \rightarrow Si$ (solid)$+4HCl$ (gas)). The fluid 24 (i.e., 4HCl) may be "trapped" in chamber 22 at a desired, predetermined and/or selected pressure and relatively low temperature. As such, fluid 24, having a selected, desired and/or predetermined state, may provide a desired, predetermined and/or selected mechanical damping for the structures 20a-d.

As mentioned above, there are many deposition techniques and materials that are suitable for forming, depositing and/or growing second encapsulation layer 26b. For example, a CVD technique may be employed to deposit, for example, doped and undoped oxides (for example, $SiO_4(CH_4)_x + O_2 \rightarrow SiO_2$ (encapsulating layer 26b)$+O_2$ (fluid 24)+a carbon by-product (fluid 24)), as well as silicon nitride and/or polysilicon. Accordingly, all materials and formation, deposition and growth techniques, and permutations thereof, for forming, depositing and/or growing second encapsulation layer 26b, whether now known or later developed, are intended to be within the scope of the present invention.

It should be noted that the residual gas(es) may be trapped in chamber 22 at a desired, predetermined and/or selected pressure. Moreover, where the trapped gas(es) is not at a (or within a range of) desired, predetermined and/or selected "final" pressure, the pressure of the gas(es) may be modified, changed and/or controlled, via subsequent process (for example, high temperature processing that causes diffusion or further/continuing reactions), so that the "completed" MEMS 10 includes a micromachined mechanical structure 12 that is properly damped (i.e., at, or within a range of, the desired, predetermined and/or selected mechanical damping for structure 12). Thus, the state of fluid 24 (for example, the pressure of fluid 24) immediately after encapsulation may be adjusted, modified and/or controlled by a subsequent micromachining and/or integrated circuit processing. In this way, the state of fluid 24 may be adjusted, modified and/or controlled to provide a desired and/or predetermined environment over the operating lifetime of the finished MEMS and/or after subsequent micromachining and/or integrated circuit processing.

In another set of embodiments, the one or more additional gases/materials react with the environment (for example, solids and/or gases in and/or around micromachined mechanical structure 12, mechanical structures 20a-d and/or chamber 22) to provide fluid 24 that is "trapped" in chamber 22 after chamber 22 is "sealed". However, in these embodiments, the one or more gases/materials do not have a significant role in forming, growing and/or depositing encapsulation layer 26b. In these embodiments, the predetermined gas/material are in addition to the primary or secondary reagents of the deposition process and react with the environment during encapsulation to provide fluid 24 (having a desired, selected and/or predetermined state) that is "trapped" within chamber 22. As mentioned above, fluid 24 provides a desired, predetermined and/or selected mechanical damping for structures 20a-d.

For example, in one embodiment, where second encapsulation layer 26b is silicon dioxide (for example, $O_2+2Si \rightarrow SiO_2+2SiO$) an APCVD may be employed to deposit the oxide at relatively high pressures (100 to 10 kPa) and low temperatures (350° C. to 400° C.). The residual 2SiO (i.e., fluid 24) may be "trapped" in chamber 22 at a relatively high pressure and relatively low temperature. As mentioned above, where necessary or desired, the pressure of fluid 24 may also be adjusted or modified during subsequent processing steps to provide the desired, predetermined and/or selected mechanical damping for mechanical structures 20a-d. As mentioned above, in those situations where a relatively high mechanical damping is desired (for example, where micromachined mechanical structure 12 is an accelerometer that requires a low Q), it may be advantageous for the final pressure of fluid 24 in chamber 22 to be relatively high. As such, where a relatively high pressure of fluid 24 is desired, it may be advantageous to employ low temperature techniques for depositing, forming and/or growing second encapsulation layer 26b. In this regard, as the sealing temperature is decreased, the pressure at the operating temperature will increase by approximately the ratio of the absolute temperatures. As such, lower "sealing" temperatures may contribute to a higher pressure of fluid 24 when chamber 22 is "sealed".

Moreover, it may be important that the partial pressure of the gas/material that comprises fluid 24 be relatively high so that the pressure of fluid 24 that resides or is "trapped" in "sealed" chamber 22 is relatively high. In this regard, as the partial pressure of the gas (for example, the relatively stable gas) increases during the encapsulation or chamber sealing process (i.e., during the deposition, formation and/or growth of second encapsulation layer 26b), the pressure of fluid 24 in chamber 22 increases proportionally. As such, it may be advantageous to minimize or reduce the flow of other process gases during the encapsulation process in those situations where it is desired to have a high final pressure of fluid 24.

It should also be noted that, in those situations where a high final pressure of fluid 24 is desired, it may also be advantageous to implement the encapsulation process (i.e., the process of depositing, forming and/or growing second encapsulation layer 26b) at a high, elevated and/or maximum total pressure to enhance and/or maximize the final pressure of fluid 24. In this way, a relatively high mechanical damping of micromachined mechanical structure 12 may be achieved.

Figure 6:
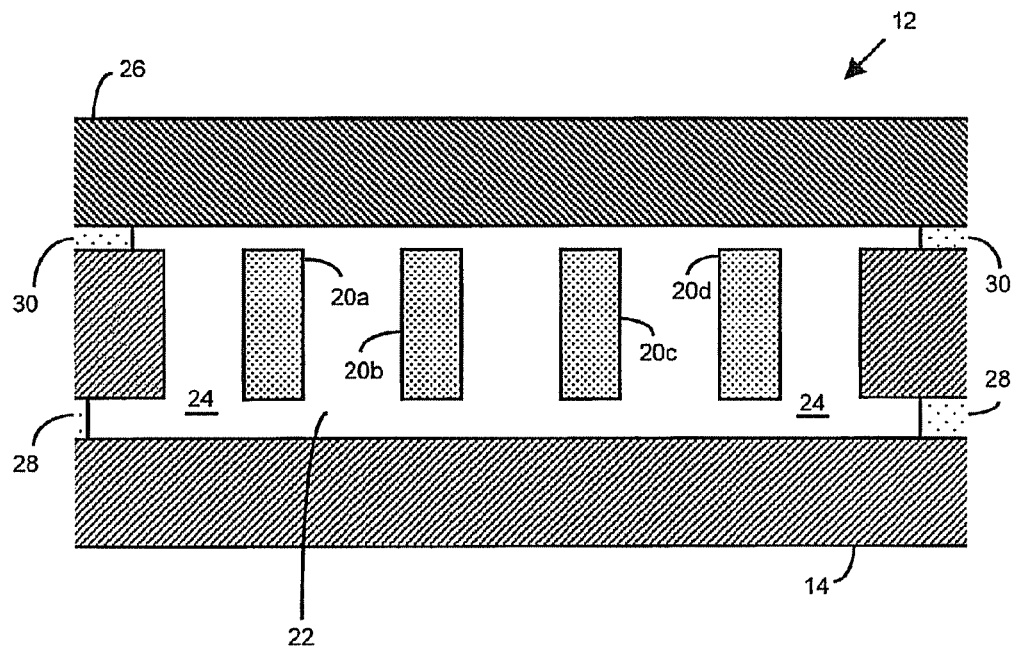
FIG. 6 illustrates a cross-sectional view of the portion of the interdigitated or comb-like finger electrode array of FIG. 2, sectioned along dotted line a-a, in accordance with another aspect of the present invention where encapsulation layers are annealed such that the encapsulation layers have the properties of a layer that was deposited in one or substantially one processing step.
Figure 7A:
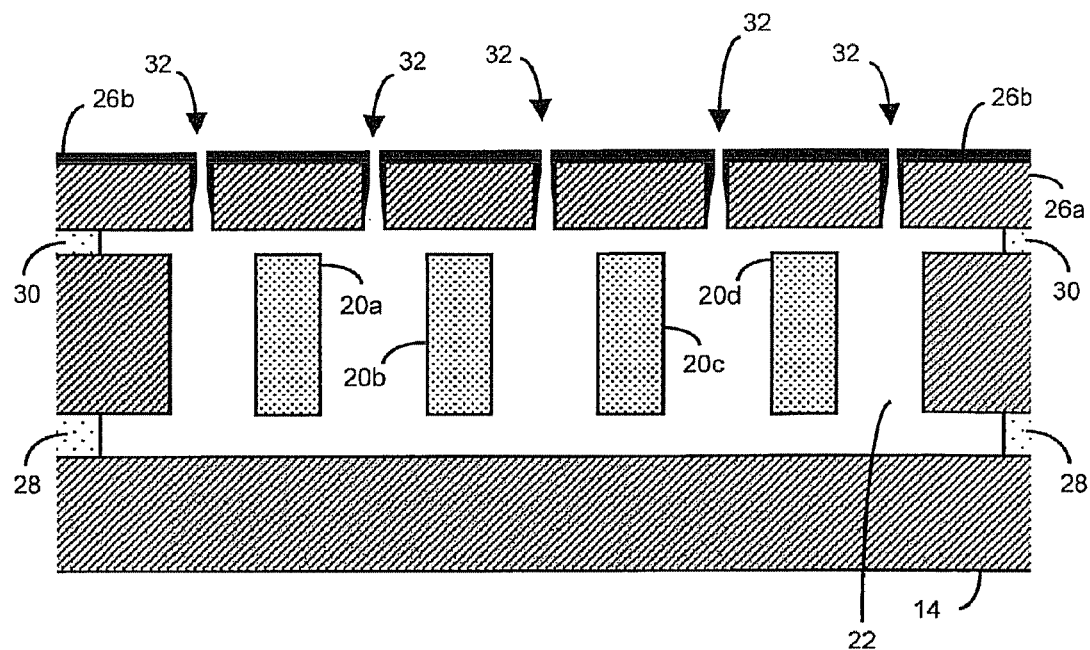
FIGS. 7A, 7B, and 8A-8C illustrate cross-sectional views of a portion of the fabrication of the interdigitated or comb-like finger electrode array microstructure of FIG. 2, sectioned along dotted line a-a, in accordance with another aspect of the present invention where encapsulation layers include three or more layers.
Figure 7B:
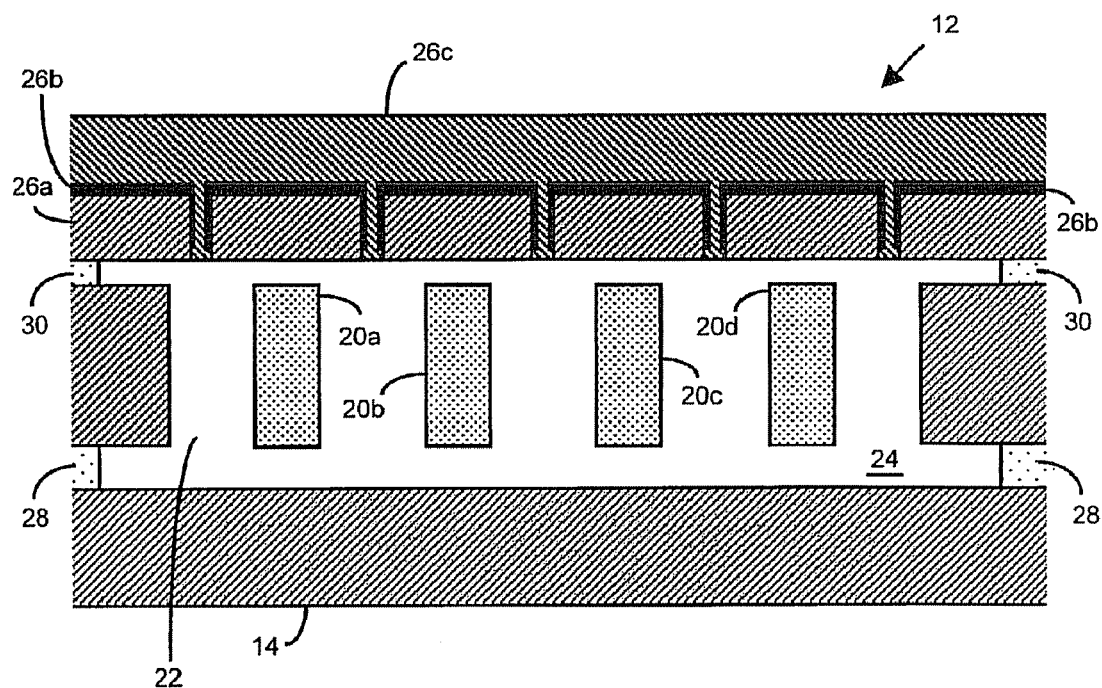

It should be further noted that, in certain embodiments, the encapsulation layer that "traps" and "seals" fluid 24 in chamber 22 may be sufficiently annealed to function as if the encapsulation layers 26a and 26b were deposited, formed and/or grown during one or substantially one processing step (see, FIG. 6). Such an encapsulation layer may provide a better "seal" of chamber 22 so that fluid 24 is less susceptible to diffusion over the lifetime of the MEMS and/or under harsh external operating environments. Moreover, the encapsulation process of chamber 22 may include three or more encapsulation layers. With reference to FIGS. 7A and 7B, in another set of embodiments, a second encapsulation layer 26b may be deposited, formed and/or grown. In this set of embodiments, however, second encapsulation layer 26b does not entirely "seal" chamber 22. Rather, a third encapsulation layer 26c (or subsequent layer 26x) "seals" chamber 22 and "traps" fluid 24 in chamber 22.

The second encapsulation layer 26b may be, for example, a semiconductor material (for example, a monocrystalline, polycrystalline silicon or germanium), an insulator material (for example, silicon dioxide, silicon nitride, BPSG, or PSG) or metal bearing material (for example, suicides or TiW), which is deposited using, for example, an epitaxial, a sputtering or a CVD-based reactor (for example, APCVD, LPCVD or PECVD). The deposition, formation and/or growth may be by a conformal process or non-conformal process. The material comprising encapsulation layer 26b may be the same as or different from first encapsulation layer 26a.

Thereafter, third encapsulation layer 26c may be deposited, formed and/or grown (see, FIG. 7B). The third encapsulation layer 26c may "seal" or close chamber 22 and, as such, "trap" fluid 24 (having a selected, desired and/or predetermined state) in chamber 22.

The deposition, formation and/or growth of third encapsulation layer 26c may be the same as, substantially similar to, or different from that of encapsulation layers 26a and/or 26b. In this regard, third encapsulation layer 26c may be comprised of, for example, a semiconductor material, an insulator material, or metal bearing material. The third encapsulation layer 26c may be deposited using, for example, an epitaxial, a sputtering or a CVD-based reactor (for example, APCVD, LPCVD or PECVD). The deposition, formation and/or growth process may be conformal or non-conformal. The material comprising encapsulation layer 26c may be the same as or different from first encapsulation layer 26a and/or second encapsulation layer 26b.

As mentioned above, it may be advantageous to employ the same material to form first and second encapsulation layers 26a and 26b and/or second and third encapsulation layers 26b and 26c. In this way, the thermal expansion rates are the same and the boundaries between layers 26a and 26b may enhance the "seal" of chamber 24.

It should be noted that the entire discussion above with respect to fluid 24 and/or fluid 24 in conjunction with FIGS. 3-6 is entirely, fully and completely applicable to this set of embodiments. For the sake of brevity, it will not be repeated.

Figure 8A:
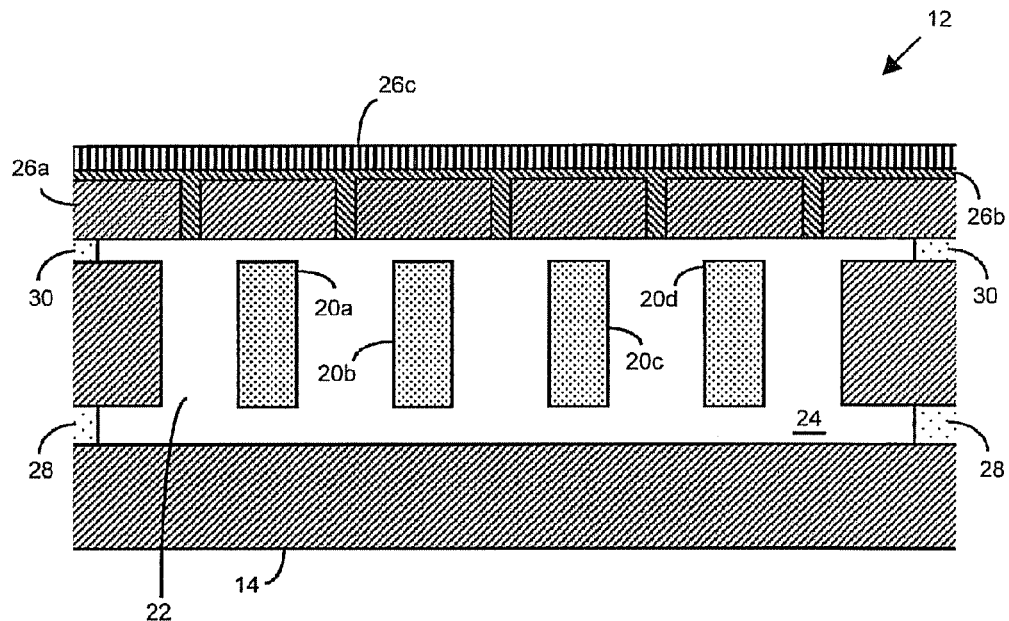
Figure 8B:
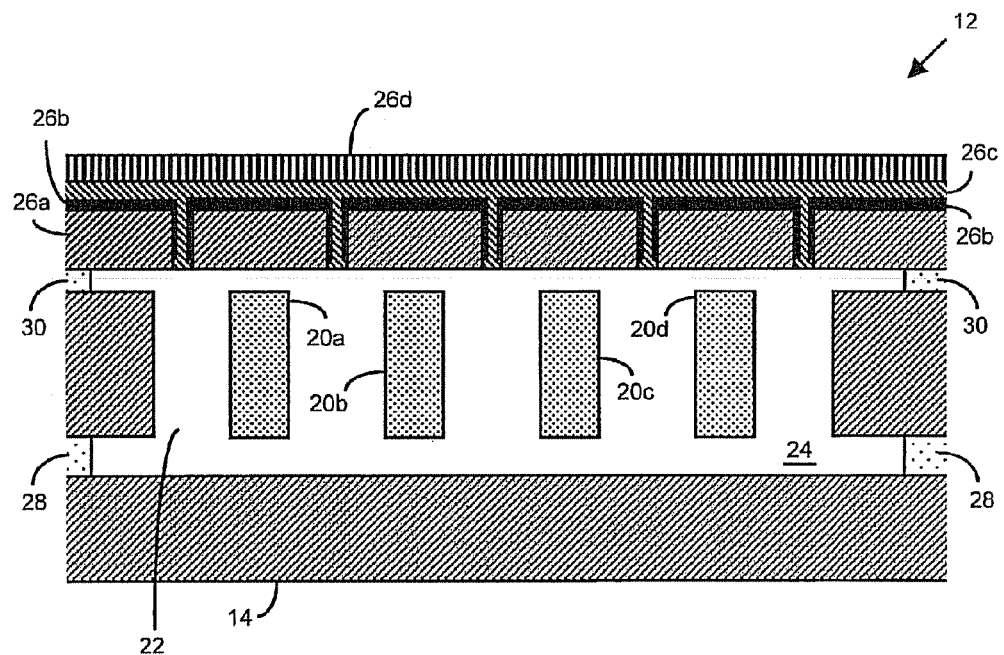

With reference to FIGS. 8A and 8B, in another set of embodiments, encapsulation layer 26c (FIG. 8A) and encapsulation layer 26d (FIG. 8B) may be deposited, formed and/or grown to enhance the "seal" of chamber 22 and thereby enhance the barrier to diffusion of fluid 24. The encapsulation layer 26c (FIG. 8A) and encapsulation layer 26d (FIG. 8B), alone, or in combination with the other encapsulation layers, "traps" fluid 24 (having a selected, desired and/or predetermined state) in chamber 22.

The encapsulation layer 26c (FIG. 8A) and encapsulation layer 26d (FIG. 8B) may be, for example, a semiconductor material (for example, a polysilicon, germanium, or silicon/germanium), an insulator material (for example, silicon dioxide, silicon nitride, BPSG, PSG, or SOG) or metal bearing material (for example, silicides). The encapsulation layer 26c (FIG. 8A) and encapsulation layer 26d (FIG. 8B) may be, for example deposited, formed or grown using, for example, an epitaxial, a sputtering or a CVD-based reactor (for example, APCVD, LPCVD or PECVD). The deposition, formation and/or growth may be by a conformal process or non-conformal process. The material comprising encapsulation layer 26c (FIG. 8A) and encapsulation layer 26d (FIG. 8B) may be the same as or different from the other encapsulation layers.

It should be noted that the discussion above with respect to fluid 24 and/or fluid 24 in conjunction with FIGS. 3-6 is entirely, fully and completely applicable to this set of embodiments. For the sake of brevity, it will not be repeated.

It should be further noted that encapsulation layer 26b (FIG. 8A) and encapsulation layer 26c (FIG. 8B), in addition to or in lieu of providing a barrier to diffusion of fluid 24, may be employed to reduce, minimize and/or eliminate any step coverage issues that may be presented when enclosing or "sealing" passages or vents 32 (see, for example, FIGS. 4E, 4F, 7A and 7B) and chamber 22. In this regard, encapsulation layer 26b (FIG. 8A) and encapsulation layer 26c (FIG. 8B) may be a material that is deposited, formed and/or grown in a manner that provides good, enhanced, adequate and/or sufficient step coverage, for example, BPSG, PSG or SOG which is deposited using, for example, a CVD-based reactor (for example, APCVD, LPCVD or PECVD). In this way, encapsulation layer 26b (FIG. 8A) and encapsulation layer 26c (FIG. 8B) may provide, or if necessary may be further processed to provide (for example, a re-flow step), a sufficiently and/or substantially planar surface.

Thereafter, encapsulation layer 26c (FIG. 8A) and encapsulation layer 26d (FIG. 8B) may be deposited, formed and/or grown using materials and/or techniques (even those having or providing poor step coverage) in order to provide an adequate and/or sufficient "seal" of chamber 22. The encapsulation layer 26c (FIG. 8A) and encapsulation layer 26d (FIG. 8B) alone, or in combination with the other encapsulation layers, "traps" fluid 24 (having a selected, desired and/or predetermined state) in chamber 22.

Figure 8C:
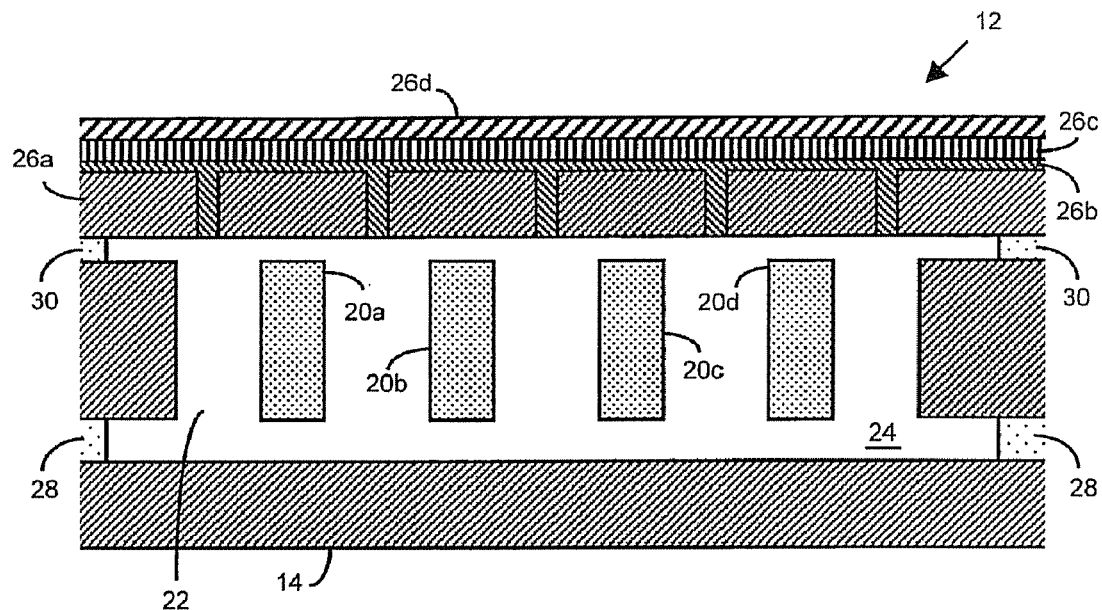

In addition, with reference to FIG. 8C, an additional encapsulation layer 26d may be deposited, formed and/or grown to further enhance the "seal" of chamber 22. In this embodiment, encapsulation layer 26c may provide some, little or no barrier to diffusion of fluid 24 whereas encapsulation layer 26d presents some, a majority or essentially the entire barrier to diffusion of fluid 24. Thus, encapsulation layer 26d, alone or together with the other encapsulation layers (i.e., encapsulation layers 26a-c), "traps" fluid 24 in chamber 22.

Further, as noted above, encapsulation layers 26b and/or encapsulation layer 26c may be employed (alone or in combination) to reduce, minimize and/or eliminate any step coverage issues that may be presented by enclosing passages or vents 32 and "sealing" chamber 22. The encapsulation layer 26b and/or encapsulation layer 26c may provide a sufficiently and/or substantially planar surface so that encapsulation layer 26c and/or encapsulation layer 26d may be implemented using a wide variety of material(s) and deposition, formation and/or growth techniques in order to "seal" of chamber 22 and "trap" fluid 24 (having a selected, desired and/or predetermined state) in chamber 22.

Accordingly, in this set of embodiments, at least one additional encapsulation layer 26d is deposited, formed and/or grown over a fully encapsulated and "sealed" chamber 22 to provide an additional barrier to diffusion of fluid 24. In this way, fluid 24 is "trapped" in chamber 22 and has a selected, desired and/or predetermined state to facilitate proper operation of mechanical structure 12.

With reference to FIGS. 8A-C, in another set of embodiments, some, a majority, all or substantially all of fluid 24 is "trapped" within chamber 22 (and the state of fluid 24 is established within a selected, predetermined and/or desired range of pressures) after depositing, forming or growing encapsulation layer 26b (FIG. 8A) and encapsulation layer 26c (FIG. 8B) while depositing, forming or growing encapsulation layer 26c (FIG. 8A) and encapsulation layer 26d (FIG. 8B). In this set of embodiments, fluid 24 may be diffused into chamber 22 after enclosed by encapsulation layer 26b (FIG. 8A) and encapsulation layer 26c (FIG. 8B). The state of fluid 24 may be established at a pressure that is sufficient to cause a gas to penetrate encapsulation layer 26b (FIG. 8A) and encapsulation layer 26c (FIG. 8B) and diffuse through that layer and into chamber 24.

For example, a gas or gas vapor, such as helium, may be introduced while encapsulation layer 26c (FIG. 8A) and encapsulation layer 26d (FIG. 8B) are being deposited, formed and/or grown. That gas or gas vapor (for example, helium) may be under sufficient pressure to diffuse through encapsulation layer 26b (FIG. 8A) and encapsulation layer 26c (FIG. 8B) into chamber 22. Moreover, after deposition, formation and/or growth of encapsulation layer 26c (FIG. 8A) and encapsulation layer 26d (FIG. 8B), the gas or gas vapor may be "trapped" in chamber 22. The encapsulation layer 26c (FIG. 8A) and encapsulation layer 26d (FIG. 8B), alone, or in combination with the other encapsulation layers, "traps" fluid 24 (having a selected, desired and/or predetermined state) in chamber 22.

Thus, in this set of embodiments, fluid 24 diffuses into chamber 22 through encapsulation layer 26a and/or encapsulation layer 26b. That diffusion may cause or result in a "final" ambient pressure of fluid 24 (i.e., the pressure of fluid 24 after completion of MEMS 10 and/or after deposition, formation and/or growth of encapsulation layer 26c (FIG. 8A) and encapsulation layer 26d (FIG. 8B)) being within a selected, predetermined and/or desired range of pressures.

In another set of embodiments, the ambient pressure of fluid 24 immediately after being "trapped" or "sealed" in chamber 24 may be selected or designed to be less than the selected, predetermined and/or desired range of mechanical damping of micromachined mechanical structure 12 required or desired during normal operation. After processing encapsulation layer 26c (FIG. 8A) and encapsulation layer 26d (FIG. 8B), the "final" ambient pressure of fluid 24 may be within the selected, predetermined and/or desired range of pressures. In this way, the subsequent micromachining processing causes a reduction in pressure of fluid 24 such that the "final" pressure of fluid 24 provides the selected, designed or predetermined mechanical damping of micromachined mechanical structure 12.

It should be noted that, in these embodiments, it may be advantageous to employ a metal bearing material (for example, silicides) to form encapsulation layer 26c (FIG. 8A) and encapsulation layer 26d (FIG. 8B). The encapsulation layer 26c (FIG. 8A) and encapsulation layer 26d (FIG. 8B) may be, for example deposited, formed or grown using, for example, an epitaxial, a sputtering or a CVD-based reactor (for example, APCVD).

In another aspect of the present invention, the MEMS may include a plurality of monolithically integrated micromachined mechanical structures having one or more electromechanical systems (for example, gyroscopes, resonators, temperature sensors and/or accelerometers). The micromachined mechanical structures may include mechanical structures that are disposed in a corresponding chamber, which includes an environment (i.e., fluid) providing a desired, predetermined, appropriate and/or selected mechanical damping for the mechanical structures.

Figure 9:
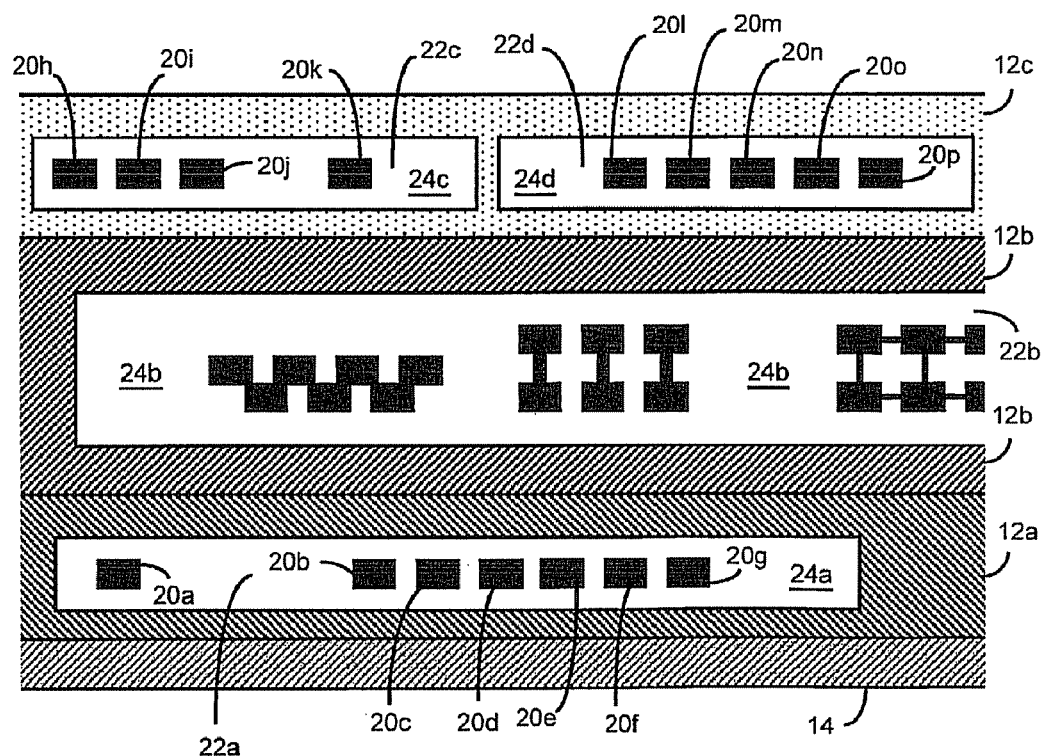
FIG. 9 illustrates a cross-sectional view of a portion of a plurality of micromechanical structures, each having one or more electromechanical systems, which are monolithically integrated on or within the substrate of a MEMS, in accordance with certain aspect of the present invention.

With reference to FIG. 9, in one embodiment, MEMS 10 includes a plurality of micromachined mechanical structures 12a-c that are monolithically integrated on or disposed within substrate 14. Each micromachined mechanical structure 12a-c includes one or more mechanical structures 20a-p (for the sake of clarity only a portion of which are numbered).

As described above in detail with respect to FIGS. 3-8C, mechanical structures 20 reside in a respective chamber 24 (for example, mechanical structures 20a-20g are disposed in chamber 22a). The chamber 22 includes fluid 24, having a selected, desired and/or predetermined state that is "trapped," "sealed" and/or contained within chamber 22. The fluid 24 provides a desired, predetermined, appropriate and/or selected mechanical damping for mechanical structures 20a-d.

In certain embodiments, fluids 24a-d are "trapped" and "sealed" in chambers 22a-d, as described above, and maintained and/or contained at the same or substantially the same selected, desired and/or predetermined state. As such, in these embodiments, fluids 24a-d may provide the same or substantially the same desired, predetermined, appropriate and/or selected mechanical damping for mechanical structures 20a-p.

In other embodiments, fluids 24a-d are "trapped," "sealed," maintained and/or contained in chambers 22a-d, as described above, to provide differing or different mechanical damping characteristics for mechanical structures 20a-p. In this way, structure 12a may include, for example, a resonator (requiring a Q of, for example, 10,000) and structure 12d may include, for example, an accelerometer (requiring a Q of, for example, 0.6). Accordingly, fluids 24a-d may provide substantially different desired, predetermined, appropriate and/or selected mechanical damping for mechanical structures 20a-p.

Indeed, in at least one embodiment, structure 12c includes a plurality of chambers, namely chambers 22c and 22d, each containing fluid 24c and 24d, respectively. The fluids 24c and 24d may be "trapped," "sealed," maintained and/or contained in chambers 22c and 22d, respectively, at the same or substantially the same selected, desired and/or predetermined states. As such, in this embodiment, fluids 24c and 24d may provide the same or substantially the same desired, predetermined, appropriate and/or selected mechanical damping for mechanical structures 20h-k and 20l-p, respectively.

Alternatively, in at least another embodiment, fluids 24c and 24d may be "trapped," "sealed," maintained and/or contained in chambers 22c and 22d, respectively, at different or substantially different selected, desired and/or predetermined states. In this embodiment, chambers 22c and 22d may be "sealed" using different processing techniques, different processing conditions and/or different materials (for example, gases or gas vapors). As such, after encapsulation, fluids 24c and 24d provide different or substantially different mechanical damping characteristics for mechanical structures 20h-k and 20*l-p*, respectively. In this way, micromachined mechanical structure 12*c* may include different electromechanical systems (for example, gyroscopes, resonators, temperature sensors and accelerometers) that require different or substantially different mechanical damping characteristics for optimum, predetermined, desired operation.

It should be noted that in the embodiment illustrated in FIG. 9, micromachined mechanical structures 12*a-c* may include the same features, attributes, alternatives, materials and advantages, as well as be fabricated in the same manner, as the mechanical structure 12 illustrated in FIGS. 1-8C, and described above. For the sake of brevity, those features, attributes, alternatives, materials, techniques and advantages will not be restated here.

Moreover, the discussion above with respect to fluid 24 and/or fluid 24 in conjunction with FIGS. 3-8C is entirely, fully and completely applicable to these sets of embodiments. For the sake of brevity, it will not be repeated.

It should be further noted that the features, attributes, alternatives, materials and advantages, as well as the fabrication techniques, of the embodiment illustrated in FIG. 9 (and described above) are fully and equally applicable to MEMS illustrated in FIGS. 1-8C. For example, micromachined mechanical structure 12 of FIG. 3 may include a plurality of chambers to maintain and/or contain fluids at the same, substantially the same, different or substantially different selected, desired and/or predetermined states (for example, micromachined mechanical structure 12*c* of FIG. 9). Accordingly, the fluids in the chambers may provide the same, substantially the same, different or substantially different mechanical damping characteristics for mechanical structures (for example, fluids 24*c* and 24*d* which are "trapped," "sealed," maintained and/or contained in chambers 22*c* and 22*d* of micromachined mechanical structure 12*c* of FIG. 9). For the sake of brevity, those features, attributes, alternatives, materials, techniques and advantages will not be restated here. There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, it may be advantageous to employ gas species that are compatible with the standard type reactors. In this way, any modifications or customizations of the reactors to, for example, form, grow or deposit second encapsulation layer 26*b*, may be minimized and/or eliminated.

Further, it may be advantageous to employ gas species that are relatively inexpensive and available to the reactor/fabrication facility. In this way, the costs of MEMS 10 may be minimized and/or reduced.

The term "depositing" means, among other things, depositing, creating, forming and/or growing a layer of material using, for example, a reactor (for example, an epitaxial, a sputtering or a CVD-based reactor (for example, APCVD, LPCVD, or PECVD)).

Finally, it should be further noted that while the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent to electromechanical systems, for example, gyroscopes, resonators, temperatures sensors and/or accelerometers, made in accordance with fabrication techniques, such as lithographic and other precision fabrication techniques, which reduce mechanical components to a scale that is generally comparable to microelectronics.

What is claimed is:

1. An electromechanical device comprising:
   a chamber including a first encapsulation layer having at least one vent;
   a mechanical structure, wherein the mechanical structure is disposed in the chamber; and
   a second encapsulation layer, deposited over or in the vent, to thereby seal the chamber, wherein the second encapsulation layer is a semiconductor material and wherein the chamber includes at least one relatively stable gas.

2. The electromechanical device of claim 1, wherein the second encapsulation layer is deposited using an epitaxial, a sputtering or a CVD reactor.

3. The electromechanical device of claim 2, wherein the first encapsulation layer is deposited using an epitaxial, a sputtering or a CVD reactor.

4. The electromechanical device of claim 1, wherein the at least one relatively stable gas is helium, nitrogen, neon, argon, krypton, xenon or perfluorinated hydrofluorocarbons.

5. The electromechanical device of claim 1, wherein the second encapsulation layer is a silicon-bearing compound.

6. The electromechanical device of claim 5, wherein the silicon-bearing compound is at least one of monocrystalline silicon and polycrystalline silicon.

7. The electromechanical device of claim 1, wherein the relatively stable gas has a low diffusivity.

8. The electromechanical device of claim 1, further including a third encapsulation layer, disposed over the second encapsulation layer, to reduce the diffusion of the fluid from the chamber.

9. The electromechanical device of claim 8, wherein the third encapsulation layer is a metal bearing material.

10. The electromechanical device of claim 9, wherein the metal bearing material is deposited using an epitaxial, a sputtering or a CVD reactor.

11. The electromechanical device of claim 8, wherein the third encapsulation layer is at least one of monocrystalline silicon, polycrystalline silicon, silicon dioxide, BPSG, PSG, silicon nitride or silicon carbide.

12. The electromechanical device of claim 1, further including a third encapsulation layer, disposed over the second encapsulation layer, to reduce the diffusion of the fluid from the chamber, wherein the fluid includes helium, neon or hydrogen that was diffused through the second encapsulation layer and into the chamber to adjust the pressure of the fluid to be within a predetermined range of pressures.

13. The electromechanical device of claim 12, wherein the third encapsulation layer is a metal bearing material.

* * * * *